United States Patent
Baker

(10) Patent No.: US 6,919,747 B2
(45) Date of Patent: Jul. 19, 2005

(54) CIRCUIT FOR PROVIDING RESISTANCE TO SINGLE EVENT UPSET TO PULSE WIDTH MODULATOR INTEGRATED CIRCUIT

(75) Inventor: Steve Baker, Healdsburg, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/712,461

(22) Filed: Nov. 13, 2003

(65) Prior Publication Data

US 2004/0130368 A1 Jul. 8, 2004

Related U.S. Application Data

(60) Provisional application No. 60/426,448, filed on Nov. 14, 2002.

(51) Int. Cl.[7] .................................................. H03K 3/02
(52) U.S. Cl. ........................................ 327/198; 327/143
(58) Field of Search ................................. 327/143, 198; 323/901

(56) References Cited

U.S. PATENT DOCUMENTS 4,321,554 A * 3/1982 Quilter ........................ 330/298
4,686,616 A * 8/1987 Williamson ............... 363/21.18

* cited by examiner

*Primary Examiner*—Quan Tra
(74) *Attorney, Agent, or Firm*—Ostrolenk, Faber Gerb & Soffen, LLP

(57) ABSTRACT

A circuit for use with a pulse width modulated integrated circuit having a soft-start reset function comprising a diode having a first terminal connected to a soft-start reset terminal of the integrated circuit, a voltage divider coupled between a voltage reference and a common terminal for the integrated circuit, the diode having a second terminal coupled to a tap of the voltage divider and a soft-start capacitor coupled between the second terminal of the diode and the common terminal whereby upon power startup of the integrated circuit, the soft-start capacitor is charged by the tap of the voltage divider and wherein in the event of a single event upset condition, when the soft-start reset terminal of the integrated circuit is reduced to a level at or near the level of the common terminal of the integrated circuit, the diode prevents the soft-start capacitor from discharging through the integrated circuit.

9 Claims, 2 Drawing Sheets

CIRCUIT FOR PROVIDING RESISTANCE TO SINGLE EVENT UPSET TO PULSE WIDTH MODULATOR INTEGRATED CIRCUIT

CROSS REFERENCE TO RELATED APPLICATION

The present application claims the priority and benefit of U.S. Provisional patent application Ser. No. 60/426,448 filed Nov. 14, 2002 entitled PULSE WIDTH MODULATOR INTEGRATED CIRCUIT WITH RESISTANCE TO SINGLE EVENT UPSET, the entire disclosure of which is hereby incorporated by reference herein.

BACKGROUND OF THE INVENTION

Modern DC to DC converters and switching power supplies usually use commercial Pulse Width Modulator Integrated Circuits (PWM ICs) to significantly reduce circuit complexity and total parts count. These PWM ICs generally include a soft-start feature that slowly charges an external capacitor to control the start-up rate of the switching power supply. Under various fault conditions, the PWM IC may discharge the soft-start capacitor and initialize a power supply restart to protect both the power supply and load from overstress caused by the fault. This discharge mechanism makes commercial PWM ICs unsuitable for space applications (i.e., satellites, planetary probes, International Space Station, etc.) because of the potential for Single Event Upset (SEU).

SEU is caused by energetic particles commonly encountered in the space environment. These energetic particles can inadvertently turn on semiconductor junctions and cause an undesirable change in the operation of electronic devices and systems. An SEU of the PWM IC soft-start circuit can cause temporary interruption of the power supply output, thus affecting any electronic systems that comprise the power supply load. Therefore, many power supplies and DC to DC converters intended for use in space applications utilize PWM circuits composed of many discrete components arranged in such a way as to eliminate the possibility of SEU. This increases the total component count and circuit complexity relative to a comparable design utilizing a PWM IC. The higher component count and circuit complexity generally has a negative impact on the overall power supply reliability.

FIG. 1 illustrates a conventional non-latching implementation of a soft-start reset mechanism in a PWM IC. The current source Is charges the soft-start capacitor C1 during start-up. When a fault condition or shutdown command is generated, Qd discharges C1. SEU events can inadvertently result in Qd being turned on and the quick discharge of C1, causing an interruption in normal operation of the power supply.

FIG. 2 illustrates a modification for improving the SEU response of the circuit of FIG. 1. The addition of the resistor R1 limits the discharge current through Qd. Therefore, during the SEU event, C1 will become only partially discharged thus preventing interruption of the power supply operation and allowing faster recovery from the SEU event. Since C1 is charged by the constant current source Is, R1 does not interfere with the desired charge duration of C1.

FIG. 3 illustrates a latching implementation of the soft-start reset mechanism in a PWM IC. The soft-start capacitor C1 is charged to a predetermined voltage through the resistor divider comprised of R1 and R2 during power supply start-up. When a fault condition or shutdown command is generated, the SCR is triggered and discharges C1 until the discharge current drops below the SCR's hold current. Thus, the discharge mechanism is latched until C1 is discharged to a predetermined level, at which point the discharge mechanism is reset and the power supply then re-starts. SEU events can inadvertently result in triggering of the SCR (or equivalent latching circuit), which then would force the near complete discharge of C1 and thus cause an interruption in normal operation of the power supply. Adding a resistor in series with the capacitor as in the previous example (FIG. 2) will not work in this case because the required value of resistance would be prohibitively large and thus cause interference with the desired charge duration of the capacitor C1.

The prior art circuit of FIG. 2, although helping to mitigate against SEUs, may not prevent the SEU discharge of the soft-start capacitor C1. In the circuit of FIG. 2, although the resistor R1 reduces the rate at which the capacitor discharges due to an SEU, it also reduces the rate at which the capacitor discharges in the event of an actual fault or shutdown, which is undesirable. It is desirable to provide a circuit which prevents SEUs from discharging the soft-start capacitor and which does not result in changing the capacitor charge duration in the event of an actual fault or shutdown.

It is also desirable to provide a circuit which prevents SEUs from discharging the soft-start capacitor and which also allows discharge of the capacitor in the event of actual faults or shutdown conditions.

SUMMARY OF THE INVENTION

It is accordingly an object of the present invention to provide a circuit which prevents SEU induced discharges of the soft-start capacitor and which, at the same time, allows normal charge duration of the soft-start capacitor upon start-up.

It is also an object of the present invention to provide such a circuit that, in the event of an actual fault or shutdown, allows the capacitor to be discharged.

By careful arrangement of a few discrete components external to a PWM IC, it is possible to minimize or eliminate the effects of SEU on a PWM IC's soft-start circuit while retaining most of the other features and benefits that a PWM IC may offer.

The above and other objects of the invention are achieved by a circuit for use with a pulse width modulated integrated circuit having a soft-start reset function comprising a diode having a first terminal connected to a soft-start reset terminal of the integrated circuit, a voltage divider coupled between a voltage reference and a common terminal for the integrated circuit, the diode having a second terminal coupled to a tap of the voltage divider and a soft-start capacitor coupled between the second terminal of the diode and the common terminal whereby upon power startup of the integrated circuit, the soft-start capacitor is charged by the tap of the voltage divider and wherein in the event of a single event upset condition, when the soft-start reset terminal of the integrated circuit is reduced to a level at or near the level of the common terminal of the integrated circuit, the diode prevents the soft-start capacitor from discharging through the integrated circuit.

According to a further aspect, the circuit further comprises an external fault detection and shutdown triggered circuit across the soft-start capacitor for discharging the capacitor.

Other objects, features and advantages of the present invention will be apparent from the detailed description which follows.

BRIEF DESCRIPTION OF THE DRAWING(S)

The invention will now be described in greater detail in the following detailed description with reference to the drawings in which.

DETAILED DESCRIPTION OF THE PREFERRED EMBODIMENTS

Figure 1:
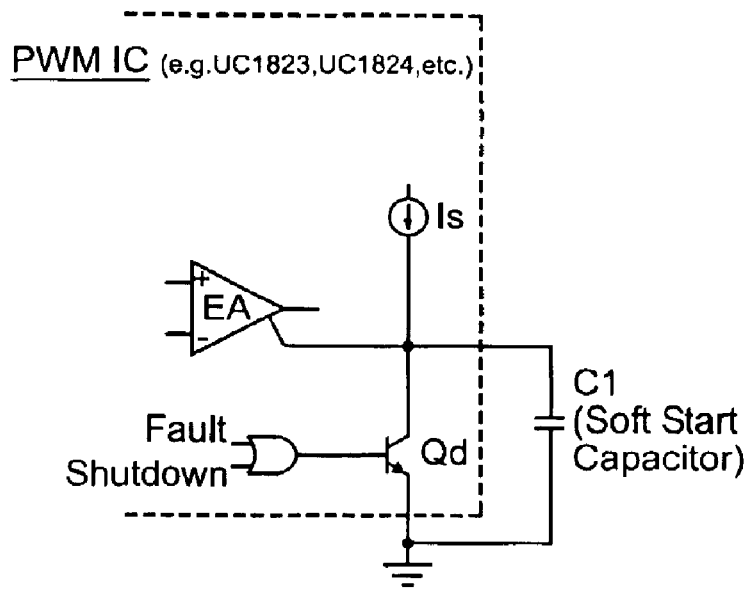
FIG. 1 shows a prior art PWM IC having a non-latching soft-start reset circuit.
Figure 2:
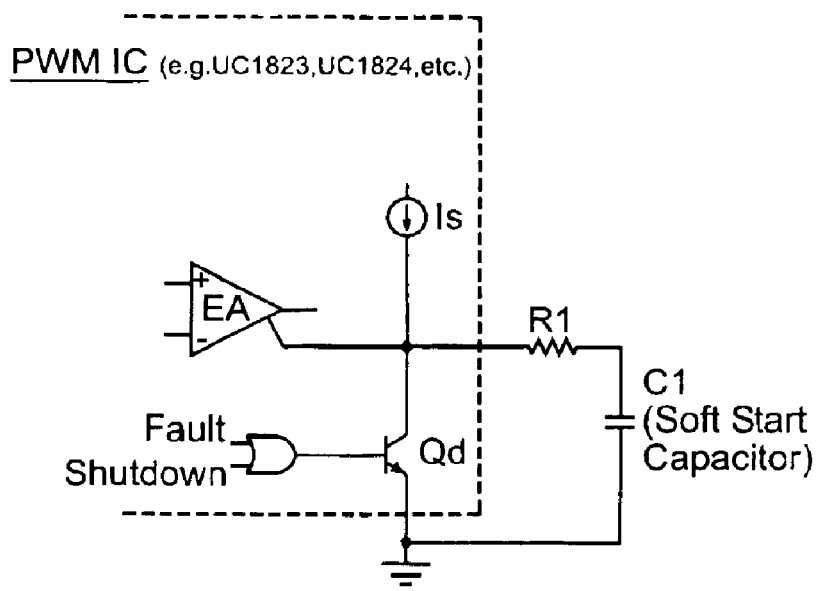
FIG. 2 shows a prior art PWM IC using a non-latching soft-start reset with external limiting resistor.
Figure 3:
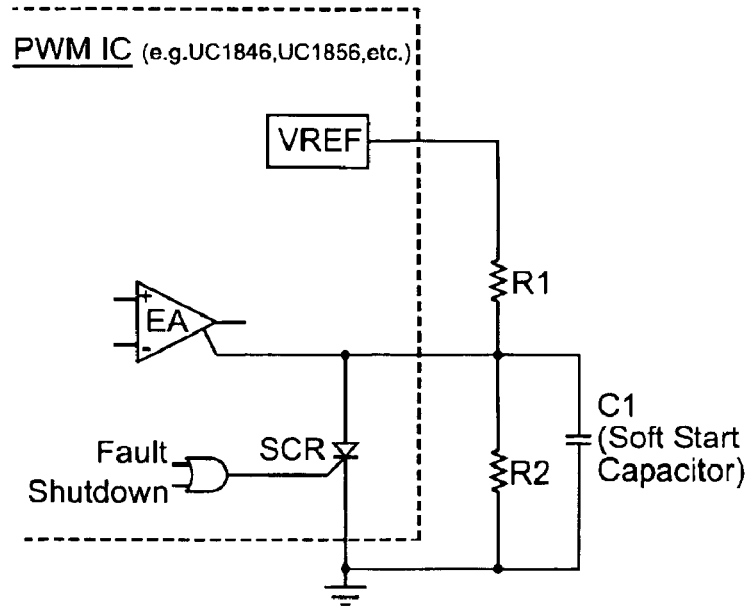
FIG. 3 shows a PWM IC using a latching soft-start reset circuit.
Figure 4:
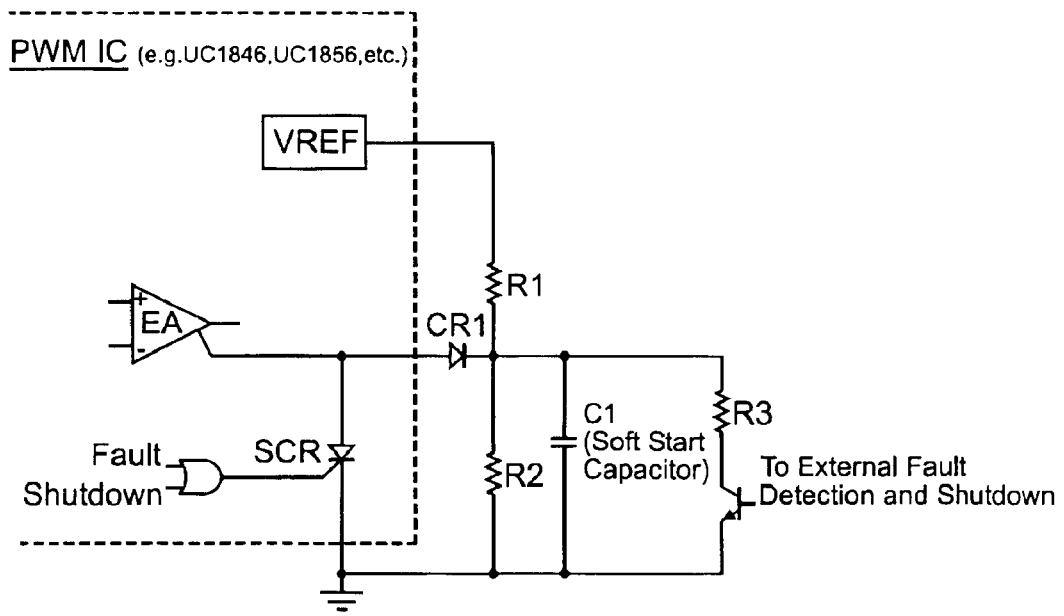
FIG. 4 shows a latching soft-start reset circuit according to the present invention which prevents SEU induced capacitor discharge and having an external reset mechanism.

With reference again to the drawings, FIG. 4 illustrates a circuit for preventing SEU induced discharge of capacitor C1. The addition of diode CR1 prevents the PWM IC from discharging capacitor C1 while not affecting the desired charge duration of C1. Q1 and R3 provide an optional SEU tolerant mechanism for discharging C1 in the event of a fault or shutdown condition.

The start-up capacitor C1 charges via the voltage divider comprised of resistors R1 and R2. Transistor Q1 is normally off.

In the event of an SEU turning on the SCR, the diode CR1 prevents the capacitor C1 from discharging through the SCR.

In the event of a fault of shutdown, the soft-start capacitor C1 cannot discharge through the SCR because of diode CR1. An alternate mechanism is provided to discharge the soft-start capacitor in the event of a fault or shutdown condition. This is provided by transistor Q1 which, if turned on by a fault or a shutdown condition, it will allow the capacitor C1 to discharge through the series circuit comprising R3 and Q1.

Accordingly, a commercially available PWM IC may be used in applications where SEUs occur, for example in space and military applications, because the soft-start capacitor will not be discharged in the event of an SEU and therefore will not shutdown the power supply for the device. A separate fault detection and shutdown circuit is provided comprising transistor Q1 and resistor R3 to provide shutdown and fault detection. Further, the circuit according to the invention does not interfere with the normal capacitor charge duration since the capacitor C1 charges through resistor R1.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit comprising:
    a pulse width modulated integrated circuit having a soft-start reset function and a soft-start reset terminal connected thereto;
    a diode having a first terminal connected to the soft-start reset terminal of the integrated circuit;
    a voltage divider coupled between a voltage reference and a common terminal for the integrated circuit, the diode having a second terminal coupled to a tap of the voltage divider; and
    a soft-start capacitor coupled between the second terminal of the diode and the common terminal; whereby upon power startup of the integrated circuit, the soft-start capacitor is charged by the tap of the voltage divider and wherein in the event of a single event upset condition, when the soft-start reset terminal of the integrated circuit is reduced to a level at or near the level of the common terminal of the integrated circuit, the diode prevents the soft-start capacitor from discharging through the integrated circuit.

2. A circuit for use with a pulse width modulated integrated circuit having a soft-start reset function comprising:
    a diode having a first terminal connected to a soft-start reset terminal of the integrated circuit;
    a voltage divider coupled between a voltage reference and a common terminal for the integrated circuit, the diode having a second terminal coupled to a tap of the voltage divider;
    a soft-start capacitor coupled between the second terminal of the diode and the common terminal; whereby upon power startup of the integrated circuit, the soft-start capacitor is charged by the tap of the voltage divider and wherein in the event of a single event upset condition, when the soft-start reset terminal of the integrated circuit is reduced to a level at or near the level of the common terminal of the integrated circuit, the diode prevents the soft-start capacitor from discharging through the integrated circuit; and
    an external fault detection and shutdown triggered circuit coupled across said soft-start capacitor for discharging the capacitor.

3. The circuit of claim 2 wherein the external fault detection and shutdown circuit comprises a switch coupled across said soft-start capacitor.

4. The circuit of claim 3, wherein the switch is disposed in series with a resistor across the soft-start capacitor.

5. The circuit of claim 4, wherein the switch comprises a transistor having a control terminal coupled to an external fault detection and shutdown signal.

6. A circuit for use with a pulse width modulated integrated circuit (PWM IC) having a soft-start reset function comprising:
    a diode having a first terminal connected to a soft-start reset terminal of the integrated circuit;
    a voltage divider coupled between a voltage reference and a common terminal for the integrated circuit, the diode having a second terminal coupled to a tap of the voltage divider; and
    a soft-start capacitor coupled between the second terminal of the diode and the common terminal; whereby upon power startup of the integrated circuit, the soft-start capacitor is charged by the tap of the voltage divider and wherein in the event of a single event upset condition, when the soft-start reset terminal of the integrated circuit is reduced to a level at or near the level of the common terminal of the integrated circuit, the diode prevents the soft-start capacitor from discharging through the integrated circuit;
    wherein the PWM IC has a semiconductor switch coupled between the common terminal and the soft-start reset terminal.

7. The circuit of claim 6, wherein the switch in the PWM integrated circuit comprises a thyrisistor.

8. The circuit of claim 1, wherein the voltage divider comprises a resistor divider circuit.

9. The circuit of claim 1, wherein the diode is polarized such that the first terminal is the anode and the second terminal is the cathode.

* * * * *